United States Patent [19]

Kawai

[11] Patent Number: 5,671,057
[45] Date of Patent: Sep. 23, 1997

[54] ALIGNMENT METHOD

[75] Inventor: Hidemi Kawai, Chiba-ken, Japan

[73] Assignee: Nikon Corporation, Tokyo, Japan

[21] Appl. No.: 698,095

[22] Filed: Aug. 15, 1996

[30] Foreign Application Priority Data

Aug. 18, 1995 [JP] Japan .................................. 7-210621

[51] Int. Cl.$^6$ .................................................. G01B 11/00
[52] U.S. Cl. .......................... 356/399; 356/400; 356/401
[58] Field of Search .................................. 356/399, 400, 356/401; 359/392, 382

[56] References Cited

U.S. PATENT DOCUMENTS

| | | | |
|---|---|---|---|
| 5,125,791 | 6/1992 | Volovich | 356/400 |
| 5,127,738 | 7/1992 | Mattila | 356/400 |
| 5,365,342 | 11/1994 | Ayata et al. | 356/400 |

*Primary Examiner*—Frank G. Font
*Assistant Examiner*—Reginald A. Ratliff
*Attorney, Agent, or Firm*—Armstrong, Westerman, Hattori, McLeland & Naughton

[57] ABSTRACT

An alignment method for use with an exposure apparatus including first and second alignment sensor systems for establishing alignment between a reticle and a wafer. A first one of reticles in a reticle set is loaded on the exposure apparatus and the position of the pattern center of the reticle is determined. At the same time, the position of the detection center of the first alignment sensor system is determined and the baseline amount $B_{11}$, which is the distance from the pattern center of the reticle to the detection center of the first alignment sensor system, is determined. Then, the baseline amount $B_{21}$ of the second alignment sensor system is determined, and the difference $\Delta B$ ($=B_{21}-B_{11}$) between the baseline amounts is calculated. For any of the second and later ones of the reticles in the reticle set, the baseline amount $B_{12}$ of the first alignment sensor system is calculated in the same manner as the above whereas the baseline amount $B_{22}$ of the second alignment sensor system is calculated as: $B_{22}=B_{12}+\Delta B$. Fine alignment procedure is performed by using the second alignment sensor system and based on the baseline $B_{22}$ thus calculated, and the pattern of the reticle is printed on each of the shot areas on a substrate by exposure.

3 Claims, 4 Drawing Sheets

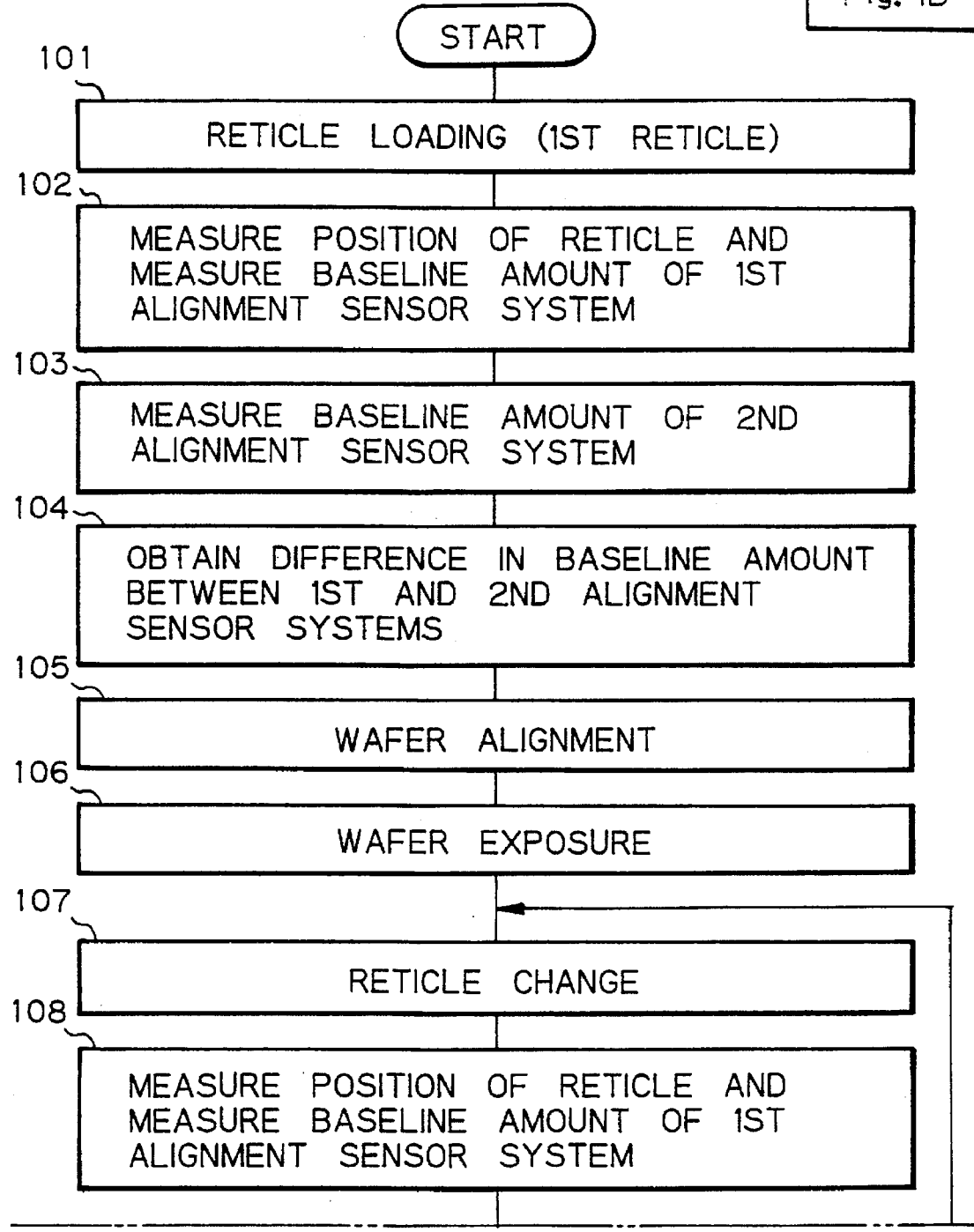

ALIGNMENT METHOD

BACKGROUND OF THE INVENTION

1. Field of the Invention

The present invention relates to an alignment method for establishing alignment between a mask (such as a reticle) and a substrate (such as a wafer) in an exposure apparatus, which alignment method is particularly suitable for use with an exposure apparatus in which two or more alignment sensor systems are successively used for establishing alignment.

2. Description of the Related Art

Various projection exposure apparatus (or projection printers) such as steppers are used for fabricating semiconductor devices, liquid crystal displays, image-sensing devices (such as charge-coupled devices), thin film magnetic heads or the like. In such a projection exposure apparatus, a circuit pattern formed on a mask or reticle is transferred onto a photoresist film formed on a photosensitive substrate such as a wafer (or a glass plate, etc.), in which the circuit pattern is overlaid on a previously defined pattern with high registration. In order to achieve the high registration, it is required to establish alignment between the reticle and the wafer with precision.

For such precision alignment, there have been proposed various types of alignment sensor systems including: "laser step alignment (LSA) type" in which a wafer has an alignment mark formed thereon comprising an array of dots, and a laser beam illuminates the alignment mark so as to produce diffracted or scattered beams, which are used to detect the position of the alignment mark; "field image alignment (FIA) type" in which an image-sensing device is used to take an image of an alignment mark formed on a wafer, which alignment mark is illuminated by illumination light having a continuous spectrum of a wide wavelength range obtainable from a halogen lamp, and the picture data of the image undergoes the image processing so as to measure the position of the alignment mark; and "laser interferometric alignment (LIA) type" in which a wafer has an alignment mark formed thereon comprising a diffraction grating, two laser beams having the same frequency or having different frequencies with a small difference between them illuminate the alignment mark from different directions so as to produce two diffracted beams interfering with each other, and the position of the alignment mark is determined from the phase of the interference.

There have been also proposed various types of alignment techniques including: "through-the-lens (TTL) type" in which the position of a wafer is measured through a projection optical system; and "off-axis type" in which the position of a wafer is measured directly, that is, not through a projection optical system. There have been also used alignment techniques of the type called "through-the-reticle (TTR) type" in which any error in alignment between an alignment mark on a reticle and an alignment mark on a wafer is detected through both the reticle and a projection optical system.

A suitable type of alignment sensor system as well as a suitable type of alignment technique are chosen from the various types including those listed above, depending on the purpose of the exposure apparatus. The alignment sensor system of the TTL type or the off-axis type has its detection center not coincident with the center of the projected image of the reticle pattern (this is referred to as the "pattern center" hereinafter). Therefore, a baseline measurement needs to be performed, which is the procedure to accurately measure any two-dimensional error in alignment between the pattern center of the reticle and the detection center of the alignment sensor to be used (such error is referred to as the "baseline amount"), prior to the alignment procedure for establishing alignment between the reticle and the wafer. In the following, a baseline measurement procedure forming a part of background art of the present invention will be described with reference to FIG. 3, which procedure relates to a projection exposure apparatus including first and second alignment sensor systems using different types of sensing techniques: the first is an FIA-type system using an off-axis-type alignment technique; while the second is an LSA-type system using a TTL-type alignment technique. The projection exposure apparatus further includes reticle alignment microscopes used to determine the position of the reticle loaded on the projection exposure apparatus. The final wafer alignment procedure is performed using the second, LSA-type alignment sensor system.

FIG. 3 is a flow chart showing the exemplified method for the baseline measurement which may be performed in the projection exposure apparatus having the arrangement as described above. In step 201 of FIG. 3, a reticle is changed for a new one. Then, in step 202, positioning of a wafer stage is performed such that two reference marks ("reference marks A" hereinafter) on a reference mark bearing member mounted on the wafer stage are located within respective observation fields of the two reticle alignment microscopes, and the reticle alignment microscopes are used to measure any error in alignment between each of two predefined alignment marks on the reticle and corresponding one of the two reference marks A so as to determine the position of the pattern center of the reticle. At the same time, the displacement of the detection center of a microscope of the first alignment sensor system from a reference mark ("reference mark B" hereinafter), which is another reference mark than the reference marks A, is measured. The distance between the reference mark B and the reference marks A has been measured and thus is known. Then, the relative position or displacement of the detection center of the first alignment sensor system from the pattern center of the reticle (i.e., the baseline amount 1 of the first alignment sensor system for that reticle) is determined by calculation using the distance.

Then, in step 203, the position of a further reference mark ("reference mark C" hereinafter) on the reference mark bearing member is detected by the second alignment sensor system while the wafer stage is moved at a constant velocity. The distances between any two of the reference marks A, B and C have been measured and thus are known, so that the relative position or displacement of the detection center of the second alignment sensor system from the pattern center of the reticle (i.e., the baseline amount 2 of the second alignment sensor system for that reticle) is determined by calculation.

Then, in step 204, the second alignment sensor system is used to perform a wafer alignment procedure using "enhanced global alignment (EGA) technique" (such as disclosed in Japanese published patent application No. Sho 61-44429 (44429/1986). Then, in step 205, the circuit pattern of the reticle is printed onto each of the shot areas on the wafer by projection exposure. Steps 204 and 205 are repeated for each of the wafers in one lot to be processed using that reticle. In step 206, it is determined whether the entire exposure procedure for the wafers in the lot has been completed. If not, the process returns to step 201, where the reticle is changed for a still new one. Therefore, the measurement procedures of the baseline amounts of the first and second alignment sensor systems in step 202 and 203, respectively, need to be repeated whenever a reticle change is made.

In the above procedure, which forms a part of background art of the present invention, the first alignment sensor system is an FIA-type system which will perform measurement while keeping the wafer stage in a stationary positioned, whereas the second alignment sensor system is an LSA-type system which will perform measurement while moving the wafer stage at a constant velocity for scanning. Thus, it is impossible to operate the first and second alignment sensor systems simultaneously for their measurements of the baseline amounts 1 and 2. That is, steps 202 and 203 can not be performed at the same time.

In addition, step 202 includes measuring of any error in orientation, or rotational position in a horizontal plane, of the reticle with respect to the running direction of the wafer stage (the rows in the array of the shot areas on the wafer extend in this direction) by measuring the error in alignment between the two alignment marks on the reticle and the associated two reference marks A on the reference mark bearing member on the wafer stage by means of the reticle alignment microscopes. Thus, steps 202 and 203 can not be performed at the same time not only where two alignment sensor systems used are of the FIA- and LSA-types, but also where alignment sensor systems of two different types are used which may be any of various types of alignment sensor systems.

Thus, in cases where reticles are frequently changed during the exposure procedure of the wafers in one lot such as often experienced when manufacturing many kinds of products in small amount, for example, application specific integrated circuits (ASICs), the necessity of performing the baseline measurements of both the two alignment sensor systems whenever a reticle change is made, disadvantageously results in a long time required for the baseline measurements and hence in a low productivity.

SUMMARY OF THE INVENTION

It is an object of the present invention to provide an alignment method which may reduce the time required for the baseline measurements of two or more alignment sensor systems provided in a projection exposure apparatus.

According to a first aspect of the present invention, there is provided an alignment method for use with an exposure apparatus including first and second alignment sensor systems using different types of sensing techniques for detecting the position of each of shot areas on a substrate, the first and second alignment sensor systems each having a detection center, wherein detection results from at least one of the first and second sensor systems are used to establish alignment between one of the shot areas on the substrate which is to be exposed and an exposure location for a pattern of a mask so as to transfer the pattern onto the shot areas; the method comprising: a first step for measuring a relative position of the detection center of the first alignment sensor system with respect to an exposure center of a pattern of a first mask (such as the baseline amount of the first alignment sensor system) and a relative position of the detection center of the second alignment sensor system relative to the exposure center of the pattern of the first mask (such as the baseline amount of the second alignment sensor system), and obtaining the difference between the relative positions; a second step for using one of the first and second alignment sensor systems to measure the position of a given shot area on a first substrate so as to provide measurement results, and using these measurement results and the distance measured in the first step so as to establish alignment between the given shot area on the first substrate and the pattern of the first mask for transferring the pattern of the first mask onto the given shot area on the first substrate; a third step for measuring, for an exposure procedure for a pattern of a second mask, the distance between the detection center of one of the first and second alignment sensor systems which requires a shorter measurement time than the other and an exposure center of the pattern of the second mask; and a fourth step for using one of the first and second alignment sensor systems to measure the position of a given shot area on a second substrate so as to provide measurement results, and using these measurement results, the difference between the relative positions measured in the first step, and the distance measured in the third step so as to establish alignment between the given shot area on the second substrate and the pattern of the second mask.

In this alignment method according to the present invention, for any of the second and later masks in a mask set, it is necessary to measure the relative position of the detection center of only one, not both, of the first and second alignment sensor systems with respect to the exposure center of the pattern of that mask. This results in a reduction in time required for measuring the relative positions (such as the baseline amounts) of the alignment sensor systems, and hence in an increase in the throughput (or productivity) in particular when the masks are frequently changed.

Further, in this alignment method, the alignment sensor system used in the third step and the alignment sensor system used in the fourth step may not be the same. This allows the selection of the alignment sensor system having higher accuracy for use in the fourth step.

According to a second aspect of the present invention, there is provided an alignment method for use with an exposure apparatus including first and second alignment sensor systems using different types of sensing techniques for detecting the position of each of shot areas on a substrate, the first and second alignment sensor systems each having a detection center, wherein detection results from at least one of the first and second sensor systems are used to establish alignment between one of the shot areas on the substrate which is to be exposed and an exposure location for a pattern of a mask so as to transfer the pattern onto the shot areas; the method comprising the steps of: measuring, for an exposure procedure for a pattern of a given mask, a relative position of the detection center of one of the first and second alignment sensor systems with respect to an exposure center of the pattern of the given mask; and using the other of the first and second alignment sensor systems to measure the position of one of shot areas on a substrate which is to be exposed so as to provide measurement results, and using these measurement results and the relative position measured for the one of the first and second alignment sensor systems so as to establish alignment between the given shot area and the pattern of the given mask.

In this alignment method according to the present invention, the time required for measuring the relative position of the detection center of one of the alignment sensor systems with respect to the exposure center of the pattern of the mask is eliminated, so that high throughput may be achieved.

BRIEF DESCRIPTION OF THE DRAWINGS

The above and other objects, features and advantages of the present invention will be apparent from the following detailed description of a preferred embodiment thereof, reference being made to the accompanying drawings, in which:

FIGS. 1A and 1B form a flow chart illustrating an embodiment of the alignment method according to the present invention;

DESCRIPTION OF A PREFERRED EMBODIMENT

Referring now to the accompanying drawings, and in particular to FIGS. 1A, 1B, and 2 thereof, a preferred embodiment of the alignment method according to the present invention will be described in detail. This embodiment shows an exemplified application of the present invention to an alignment method to be performed in a stepper-type projection exposure apparatus using two alignment sensor systems of using different types of sensing techniques.

Figure 2:
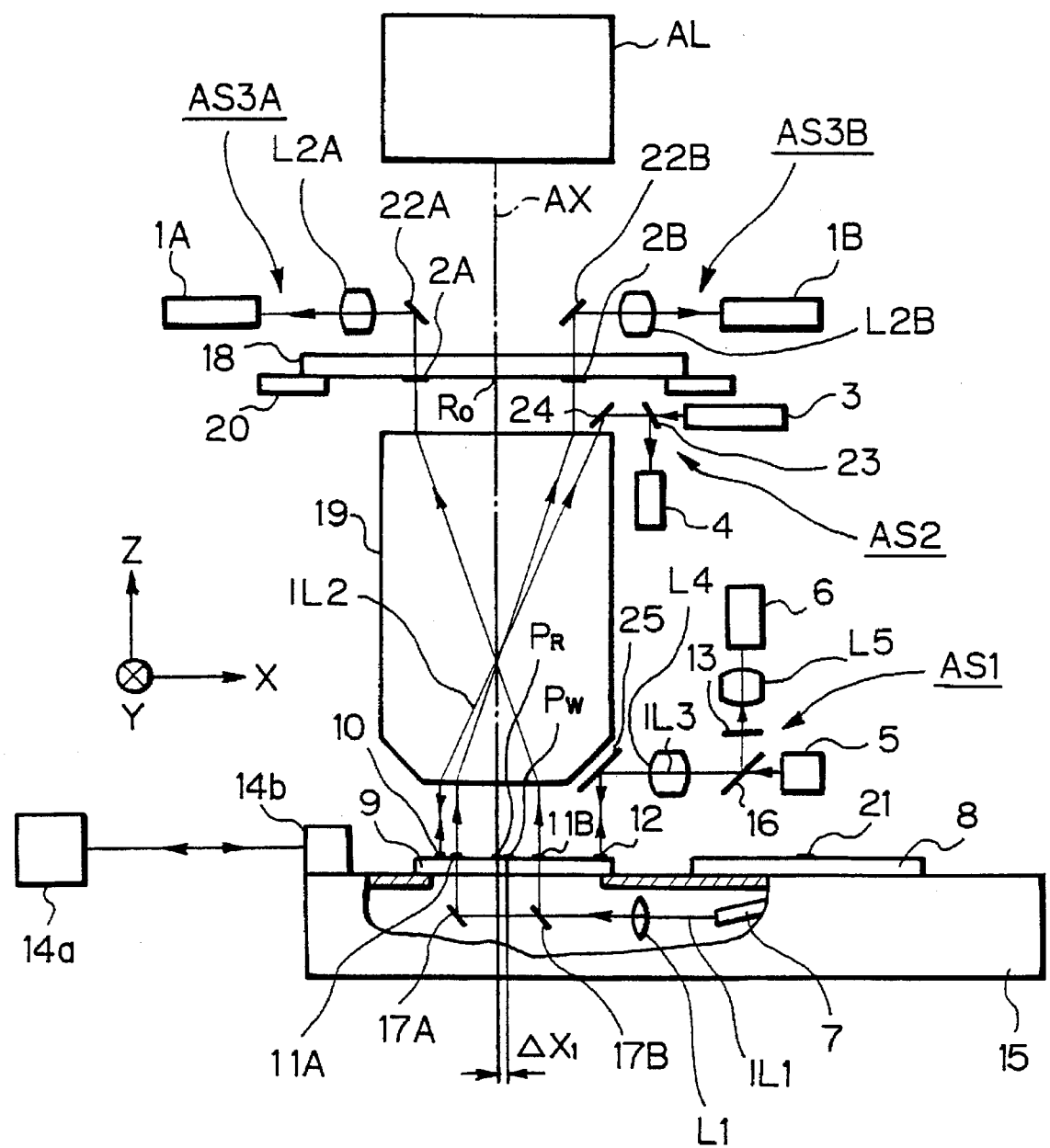
FIG. 2 is a partially cutaway schematic representation of a relevant part of a projection exposure apparatus which may be used for implementing the embodiment of the alignment method according to the present invention.
Figure 3:
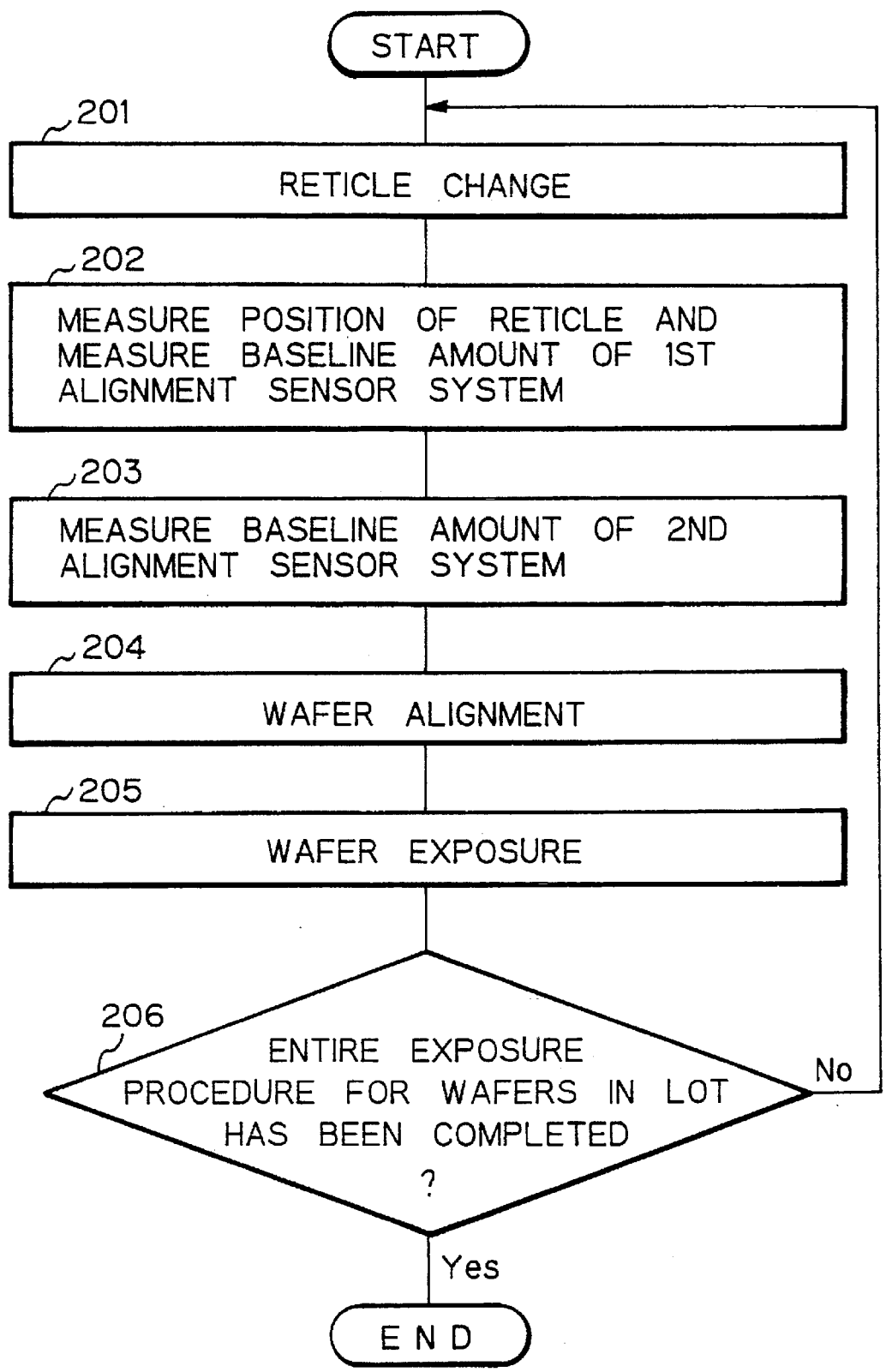
FIG. 3 is a flow chart illustrating an alignment method forming a part of background art of the present invention.

FIG. 2 shows a schematic representation of a relevant portion of a projection exposure apparatus which may be used for implementing the alignment method of the embodiment. As shown in FIG. 2, the projection exposure apparatus includes an exposure illumination system AL. When an exposure operation is performed, the exposure illumination system AL emits an illumination light beam for exposure onto a reticle 18 having a pattern formed thereon. With this illumination beam and by means of a projection optical system 19, an image of the pattern on the reticle 18 will be projected onto each shot areas on a photoresist-coated wafer 8, by projection exposure with a given demagnification ratio which may be 5:1, for example. The illumination beam may comprise I-line light in the line spectrum of a mercury-vapor lamp (having a wavelength of 365 nm), or alternatively may comprise light obtainable from any suitable excimer laser source (having a typical wavelength of, for example, 248 nm, 193 nm or others). In order to specify positions and directions in this arrangement, we define here a three-dimensional, rectangular, XYZ-coordinate system with the Z-axis extending parallel to the optical axis AX of the projection optical system 19, the X-axis perpendicular to the Z-axis and parallel to the paper surface of FIG. 2 and the Y-axis perpendicular to the paper surface of FIG. 2.

The reticle 18 is held on a movable reticle stage 20, which provides the function of positioning the reticle 18 within a plane perpendicular to the optical axis AX of the projection optical system 19 and with respect to the X-direction, the Y-direction and the rotational direction (θ-direction). For this function, the X- and Y-coordinates and the rotational angle of the reticle stage 20 are continuously measured by means of the combination of movable mirrors (not shown) fixedly mounted on the movable reticle stage 20 and laser interferometers (not shown) associated therewith and fixedly mounted on a stationary part exterior to the reticle stage 20. The laser interferometers produce the measured values to be fed to a central control system (not shown) which provides the function of general management of the entire exposure apparatus. The reticle 18 has a pattern area within which its pattern is formed and around which there are formed an X-axis reticle mark and a Y-axis reticle mark each comprising a diffraction grating (not shown). A pair of alignment marks 2A and 2B for reticle alignment are located on the outer sides of the respective reticle marks.

The wafer 8 is held on a movable wafer stage 15 through a wafer holder (not shown). The wafer stage 15 provides the function of positioning the wafer 8 within a plane perpendicular to the optical axis AX of the projection optical system 19 and with respect to the X-direction, the Y-direction and the rotational direction (θ-direction), as well as positioning the wafer 8 in the focusing direction (Z-direction). The X- and Y-coordinates and the rotational angle of the wafer 8 are continuously measured by means of the combination of movable mirrors 14b fixedly mounted on the movable wafer stage 15 and laser interferometers 14a associated therewith and fixedly mounted on a stationary part exterior to the wafer stage 15. The laser interferometers 14a produce the measured values to be fed to the central control system. The wafer 8 has a plurality of shot areas defined thereon, each of which has wafer marks 21 for wafer alignment associated therewith and formed on the wafer 8. A reference mark bearing member 9 is fixedly mounted on the wafer stage 15 at a position adjacent to the peripheral edge of the wafer 8. The reference mark bearing member 9 has various reference marks formed thereon including a reference mark for the reticle alignment and a reference mark comprising a diffraction grating with the same pitch as the diffraction gratings of the wafer marks. FIG. 2 shows the reference mark bearing member 9 located within an exposure field of the projection optical system 19 with the reference marks on the reference mark bearing member 9 being illuminated by alignment illumination beams. When an exposure operation to a shot area on the wafer 8 is to be performed, the shot area is brought into the exposure field of the projection optical system 19.

The reference mark bearing member 9 comprises a transparent glass plate on which reference marks are provided. The reference marks include: a pair of slit-shaped reference marks 11A and 11B for use with a pair of TTR-type reticle alignment microscopes (described later); a cross-shaped reference mark 12 for use with an FIA-type alignment sensor system; and a reference mark 10, comprising an array of dots, for use with an LSA-type alignment sensor system. The reference mark bearing member 9 has a circular area which contains the pair of reference marks 11A and 11B for use with the reticle alignment microscopes and which will be illuminated, when necessary, from the bottom side of the reference mark bearing member 9 with an illumination beam having the same wavelength as the illumination beam for exposure.

Next will be described constructions and operations of the alignment sensor systems provided for the projection exposure apparatus.

As mentioned above, the projection exposure apparatus is provided with the pair of reticle alignment microscopes, as well as the two alignment sensor systems using different sensing techniques for wafer alignment. The pair of reticle alignment microscopes AS3A and AS3B are of the TTR type and disposed above the reticle 18. For the reticle alignment procedure, an illumination light guide 7 extends into the interior space of the wafer stage 15 for emitting from its distal end an alignment illumination beam IL1 of light having the same wavelength as the exposure illumination beam. The alignment illumination beam IL1 passes through a converging lens L1 and split by a beam splitter 17B into two partial beams, one passing through it and the other reflected upwardly by it. The partial beam passing through the beam splitter 17B is then reflected upwardly by a mirror 17A. Each of the two illumination beams, split and directed upwardly, then illuminates associated one of the pair of slit-shaped reference marks 11A and 11B from the bottom side of the reference mark bearing member 9. Portions of the illumination beams pass through the slits of the reference marks 11A and 11B and through the projection optical system 19 to form respective images of the reference marks 11A and 11B at positions near the slit-shaped alignment marks 2B and 2A, respectively, formed on the bottom surface of the reticle 18. The beams then pass through the reticle 18 and are reflected by mirrors 22B and 22A, respectively, into objective lenses L2B and L2A, respectively, to strike the photosensitive surfaces of image-sensing devices 1B and 1A, respectively. The image-sensing devices 1B and 1A may each comprise a two-dimensional charge-coupled device (CCD), for example. Each of the objective lens L2A and L2B forms images of two marks on the photosensitive surface of the associated one of the image-sensing devices 1A and 1B. That is, an image of the reference mark 11B on the reference mark bearing member 9 and an image of the alignment mark 2A on the reticle 18 are formed overlappingly with each other on the photosensitive surface of the image-sensing device 1A, while an image of the reference mark 11A on the reference mark bearing member 9 and an image of the alignment mark 2B on the reticle 18 are formed overlappingly with each other on the photosensitive surface of the image-sensing device 1B. The image-sensing devices 1A and 1B produce picture signals which are processed for detection of any errors in alignment between the reticle 18 and the reference mark bearing member 9 on the wafer stage 15 with respect to the X- and Y-positions and the rotational angle in the XY-plane.

The first of the two alignment sensor systems for wafer alignment is of the FIA type and referred to as the first alignment sensor system AS1. The first alignment sensor system AS1 is disposed adjacent to one side of the lower portion of the projection optical system 19 and is used for the prealignment procedure of the wafer 8. Prior to the prealignment procedure, a baseline measurement is performed. For the baseline measurement, a light source 5 emits an illumination light beam IL3, which passes through a half-silvered mirror 16 and an objective lens L4 and are reflected downwardly by a mirror 25 to illuminate the reference mark 12 on the reference mark bearing member 9, from which a reflection light beam is produced. The reflection light beam from the reference mark 12, or the detection beam, travels the same light path back to the mirror 25 and reflected by it horizontally into the objective lens L4 and then again into the half-silvered mirror 16. The detection beam is reflected upwardly by the half-silvered mirror 16 into an indicator plate 13 on which an image of the reference mark 12 is optically formed. The indicator plate 13 has an indicator mark formed thereon. The detection beam then passes through the indicator mark and is converged by an image-forming lens L5 onto the photosensitive surface of an image-sensing device 6, which may comprise an image pickup device such as a two-dimensional charge-coupled device (CCD), for example. The image-forming lens L5 forms images of two marks on the photosensitive surface of the image-sensing device 6, which are a composite image of the reference mark 12 and an image of the indicator mark. Image processing is performed on these images to determine any error in alignment between them, which error in turn is used to determine the baseline amount of the first alignment sensor system AS1. When the first alignment sensor system AS1 performs the prealignment procedure to a wafer, it detects the positions of the alignment marks formed on that wafer.

The second of the two alignment sensor systems for wafer alignment is an LSA-type system using a TTL-type alignment technique, and referred to as the second alignment sensor system AS2. The second alignment sensor system AS2 is disposed adjacent to one side of the upper portion of the projection optical system 19. The second alignment sensor system AS2 is used for the final alignment procedure (or the fine alignment procedure) for establishing alignment between the reticle 18 and each shot area on the wafer 8. For the fine alignment procedure, a laser light source 3 emits a laser beam IL2 which passes through a half-silvered mirror 23 and is reflected obliquely downwardly by a mirror 24 into the upper end of the projection optical system 19. Then, the laser beam IL2 passes through the projection optical system 19 to illuminate the wafer mark 21 associated with the shot area on the wafer 8 which is being measured for the alignment. The illuminated wafer mark 21 produces diffraction light beams, one of which travels the same light path back to the projection optical system 19 and passes therethrough into the mirror 24. The diffraction beam is reflected horizontally by the mirror 24 into the half-silvered mirror 23, and then reflected downwardly by it into the photosensitive surface of a photosensor 4, which may comprise a photodiode, for example. The photosensor 4 produces an electric signal, or the detection signal, which is processed to measure the intensity of the light incident on the photosensor 4. The intensity varies with the position of the wafer, and the position of the wafer at which the intensity of the light has a maximum is used to determine the position of the wafer mark 21. Then, positioning of the shot area which is about to be exposed will be performed based on the determined position of the wafer mark 21. When the baseline measurement for the second alignment sensor system AS2 is to be performed, the reference mark bearing member 9 is located within the exposure field of the projection optical system 19 as shown in FIG. 2, and the reference mark 10 on the reference mark bearing member 9 is illuminated by the laser beam IL2. In this manner, the relative position of the detection center of the second alignment sensor system AS2 with respect to the reference mark 10 is measured.

The alignment sensor system AS2 is used for wafer alignment along one axis, such as the X-axis. Another LSA-type alignment sensor system (not shown) of the same arrangement is provided for wafer alignment along the Y-axis as well.

Figure 1B:
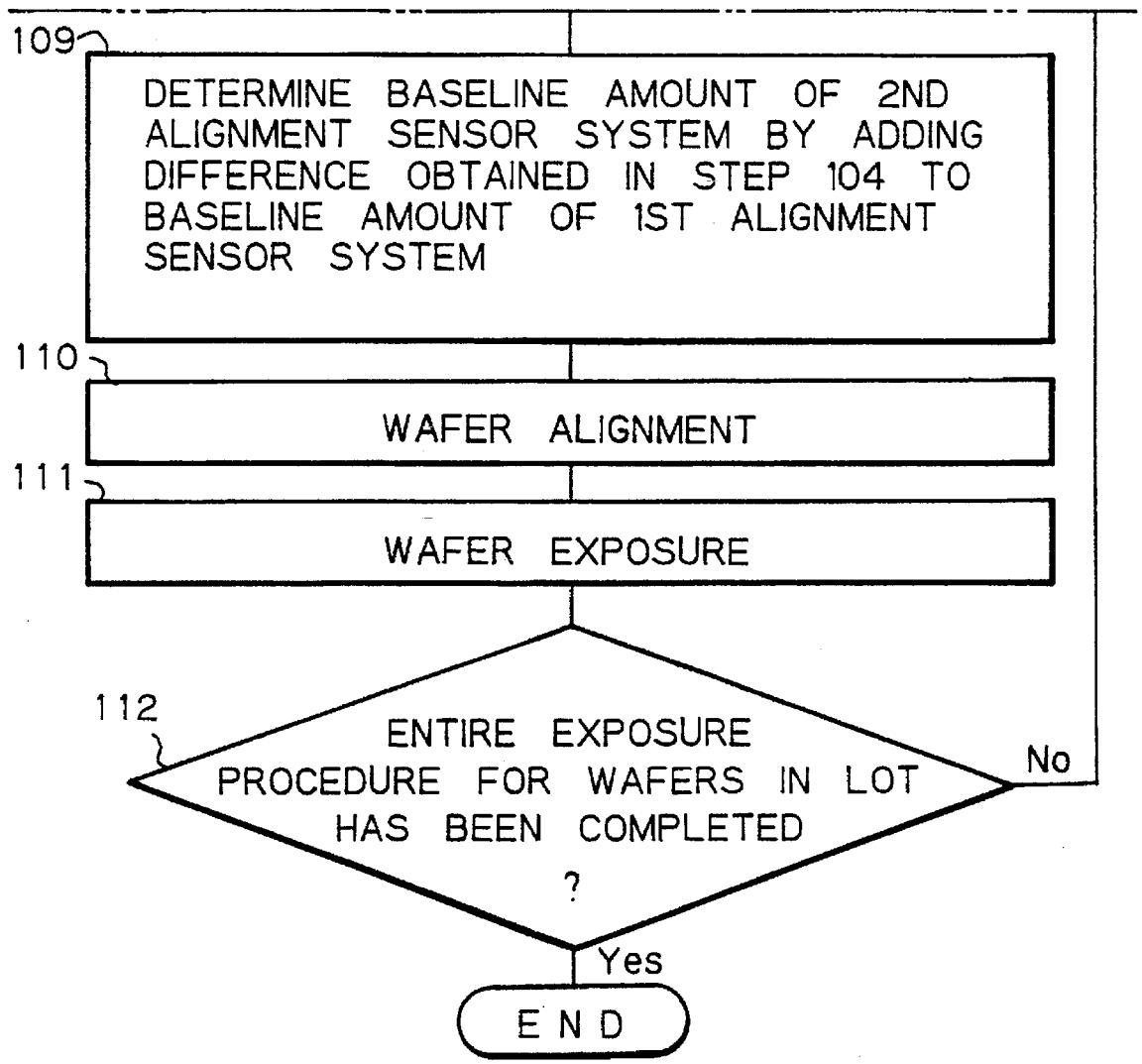

Referring next to FIGS. 1A and 1B, the operations of the first and second alignment sensor systems AS1 and AS2 for their baseline measurement procedures will be described. In the following description, the operations for obtaining their baseline amounts in the X-direction are detailed. The baseline amounts in the Y-direction can be obtained in the same manner.

FIGS. 1A and 1B show a flow chart illustrating an alignment method according to the preferred embodiment of the present invention. The flow chart includes the steps for alignment and exposure procedures using a set of reticles. First of all at step 101, the first of the reticles is loaded on the reticle stage 20. Then, in step 102, the midpoint between the pair of reference marks 11A and 11B on the reference mark bearing member 9 on the wafer stage 15 is located to the center of the exposure field of the projection optical system 19, and the reticle alignment microscopes AS3A and AS3B are used to determine any errors in alignment between each of the alignment marks 2A and 2B on the reticle and the corresponding reference marks 11B and 11A, respectively, on the reference mark bearing member 9. Then, errors in alignment in the X-direction for these two sets of marks are averaged into an alignment error $\Delta x_1$. Here, the midpoint between the alignment marks 2A and 2B on the reticle is referred to as "the reticle center $R_O$". Further, the point on the wafer at which the reticle center $R_O$ is projected by the projection optical system 19, i.e., the center of the pattern of the reticle 18, is referred to as "the pattern center $R_R$". Then, the error in alignment in the X-direction between 1) the midpoint $P_W$ between the reference marks 11A and 11B on the reference mark bearing member 9 and 2) the pattern center $R_R$ is the alignment error $\Delta x_1$ mentioned above. In addition, the rotational angle of the reticle 18 relative to the reference mark bearing member 9 is determined using the difference between errors in alignment in the Y-direction for the two sets of marks.

In step 102, the baseline measurement for the first alignment sensor system AS1 is also performed at the same time and in parallel with the operations described above. For the baseline measurement, the first alignment sensor system AS1 is used to measure the error in alignment between the image of the reference mark 12 on the reference mark bearing member 9 and the indicator plate 13 provided in the first alignment sensor system AS1, so as to detect the relative position or displacement of the detection center of the first alignment sensor AS1 with respect to or from the reference mark 12 on the wafer 8. This relative position or displacement is two-dimensional, and thus has X- and Y-components $\Delta x_2$ and $\Delta y_2$. The distances between any two of the reference marks on the reference mark bearing member 9 have been measured by a suitable precision measurement device and thus the distance $D_1$ in the X-direction between 1) the midpoint $P_W$ between the reference marks 11A and 11B and 2) the reference mark 12 is known. Using the distance $D_1$, the distance $B_{11}$ between the detection center $P_{W1}$ of the first alignment sensor system AS1 and the pattern center $P_R$ is determined by calculation as: $B_{11}=D_1+\Delta x_1+\Delta x_2$. The distance $B_{11}$ is the baseline amount in the X-direction of the first alignment sensor system AS1. The baseline amount in the Y-direction of the first alignment sensor system AS1 can be obtained at the same time because it performs measurement while keeping the wafer stationary so that the errors in alignment in the X- and Y-directions can be measured simultaneously.

Then, in step 103, the baseline amount of the second alignment sensor system AS2 is measured. In order to detect the position of the reference mark 10 on the reference mark bearing member 9, the second alignment sensor system AS2 emits the laser beam, while the wafer stage 15 is moved in the X-direction for scanning the reference mark 10 by the laser beam, so as to detect the position of the wafer stage 15 at which the intensity of the light incident on the photosensor 4 of the second alignment sensor system AS2 reaches a maximum, as described above. Here, the displacement in the X-direction of the wafer stage 15 from its initial position to the position of the maximum light intensity is represented by $\Delta x_3$, and the distance in the X-direction between the midpoint $P_W$ and the reference mark 10 by $D_2$. Then, the distance $B_{21}$ between the detection center $P_{W2}$ of the second alignment sensor system AS2 and the pattern center $P_R$ is determined by calculation as: $B_{21}=D_2+\Delta x_1+\Delta x_3$. The distance $B_{21}$ is the baseline amount in the X-direction of the second alignment sensor system AS2. Thereafter, the wafer stage 15 is moved in the Y-direction for scanning, and the baseline amount in the Y-direction of the other, LSA-type, second alignment sensor system (not shown) is determined. The baseline amounts determined in steps 102 and 103 are stored in the central control system (not shown). Then, in step 104, the difference $\Delta B$ between the baseline amount $B_{21}$ of the second alignment sensor system AS2 and the baseline amount $B_{11}$ of the first alignment sensor system AS1 is determined (i.e., $\Delta B=B_{21}-B_{11}$).

The baseline amount of the detection center of the second alignment sensor system AS2 from the pattern center of the reticle has been determined in steps 102 and 103. Based on the baseline amount thus determined, in step 105, the second alignment sensor system AS2 is used to perform the final alignment procedure (or the fine alignment procedure) to the wafer 8. The final alignment procedure may be made by using the enhanced global alignment (EGA) technique. In the EGA technique, a predetermined number of positions of selected shot areas (or the sample shot areas) on the wafer 8 are measured, by moving the wafer stage 15 for scanning the wafer marks with the laser beam so as to determine the positions of the wafer stage 15 at which the intensity of the diffraction light beams from the wafer marks associated with the sample shot areas reach to maxima, and the measured positions of the sample shot areas are used to determine the coordinates of the positions of all the shot areas on the wafer 8. Thereafter, in step 106, these coordinates are used together with the previously determined baseline amounts to sequentially align the centers of the shot areas with the pattern center of the reticle 18 and print the pattern of the reticle 18 onto the aligned shot areas with the exposure illumination beam from the exposure illumination system AL.

Thereafter, steps 105 and 106 are repeated for each of the wafers to be processed using the first reticle. Then, in step 107, the first reticle is changed for the second one in the reticle set, and the second reticle is loaded on the reticle stage 20. Next, in step 108, the reticle alignment microscopes AS3A and AS3B are used to measure the error in alignment in the X-direction of the pattern center of the second reticle, and at the same time determine the baseline amount of the first alignment sensor system AS1 for the second reticle, in the same manner as step 102. The baseline amount in the X-direction of the first alignment sensor system AS1 for the second reticle is represented by $B_{12}$.

In a typical conventional method, the baseline amount of the second alignment sensor system AS2 would be subsequently measured in the same manner as step 103. In contrast, according to the preferred embodiment of the present invention, in the next step 109, the baseline measurement for the alignment sensor system AS2 is not performed, but the baseline amount $B_{22}$ of the second alignment sensor system AS2 for the second reticle is determined by calculation from the difference $\Delta B$ between the baseline amounts $B_{11}$ and $B_{21}$ determined in step 104 and the baseline amount $B_{12}$ obtained in step 108 as: $B_{22}=B_{12}+\Delta B$.

Thereafter, in step 110, based on the baseline amount $B_{22}$ thus determined by calculation, the second alignment sensor system AS2 is used to perform the fine alignment procedure to the wafer in the same manner as step 105. Then in step 111, the pattern of the reticle is transferred to each and all of the shot areas on the wafer. Steps 110 and 111 are repeated for each of the wafers to be processed using the second reticle. The sequence including steps 107 through 111 is repeated whenever a reticle change is made. When step 112 determines that the entire exposure procedure for the wafers in the lot has been completed, then the process is ended.

It is possible that the distance between the detection centers of the first and second alignment sensor systems SA1 and SA2 may not be kept constant but produce some variation during the alignment and exposure procedures if they take a long time. However, such variation in the distance between their detection centers is negligible where the product fabricated thereby is an application specific integrated circuit, for which reticles are typically changed after being used for a relatively short time.

According to the method described above, for any and all of the reticles in the reticle set except the first one, the baseline measurement for the second alignment sensor system AS2 is eliminated. As previously mentioned, in the case where the reticles are relatively frequently changed as often experienced when manufacturing many kinds of products in small amount, for example, application specific integrated circuits, the elimination of the time for the baseline measurement provides a great advantage, i.e., it results in a significant increase in the productivity.

Further, according to the method described above, for any of the second and later reticles in the reticle set, only the first alignment sensor system AS1 needs to undergo the baseline measurement. As previously mentioned, the measurement by the reticle alignment microscopes, as well as the measurement by the first alignment sensor system AS1, can be performed for both the X- and Y-directions simultaneously with the wafer stage being kept stationary, so that the measurements by them will be quickly completed with precision, with the result that the baseline amount $B_{22}$ of the second alignment sensor system AS2 for any of the second and later reticle can be determined by calculation with high accuracy.

The above described embodiment is an exemplified application of the present invention to a method for use with a stepper-type projection exposure apparatus; however, the present invention is also applicable to a method for use with a scanning-type projection exposure apparatus such as those of the step-and-scan type in which a reticle and a wafer are moved relative to each other to perform exposure.

In an alignment method according to the present invention, for any of the second and later masks in a mask set, it is necessary to measure the relative position of the detection center of only one, not both, of the first and second alignment sensor systems with respect to the exposure center of the pattern of that mask. This results in a reduction in time required for measuring the relative positions (such as the baseline amounts) of tow or more alignment sensor systems with respect to the exposure center, and hence in an increase in the throughput (or productivity) in particular when the masks are frequently changed.

In the case where the alignment sensor system used in the third step and the alignment sensor system used in the fourth step are not the same, it is preferable to select the alignment sensor system having the shortest measurement time required for use in the third step and select the alignment sensor system having the highest accuracy for use in the fourth step, resulting in both high productivity and high accuracy in the exposure process.

Further, in an alignment method according to the present invention, the time for measuring the distance between the detection center of one of the alignment sensor systems and the exposure center of the pattern of the reticle is eliminated, so that high throughput may be achieved even when a plurality of alignment sensor systems are used.

It will be understood that the present invention is not limited to the preferred embodiment described above, but may be embodied in various other forms and arrangements without departing from the spirit and the scope of the present invention.

What is claimed is:

1. An alignment method for use with an exposure apparatus including first and second alignment sensor systems using different types of sensing techniques for detecting the position of each of shot areas on a substrate, said first and second alignment sensor systems each having a detection center, wherein detection results from at least one of said first and second sensor systems are used to establish alignment between one of said shot areas on said substrate which is to be exposed and an exposure location for a pattern of a mask so as to transfer said pattern onto said shot areas; said method comprising:

a first step for measuring a relative position of said detection center of said first alignment sensor system with respect to an exposure center of a pattern of a first mask and a relative position of said detection center of said second alignment sensor system relative to said exposure center of said pattern of said first mask, and obtaining the difference between said relative positions;

a second step for using one of said first and second alignment sensor systems to measure the position of a given shot area on a first substrate so as to provide measurement results, and using these measurement results and the distance measured in said first step so as to establish alignment between said given shot area on said first substrate and said pattern of said first mask for transferring said pattern of said first mask onto said given shot area on said first substrate;

a third step for measuring, for an exposure procedure for a pattern of a second mask, the distance between said detection center of one of said first and second alignment sensor systems which requires a shorter measurement time than the other and an exposure center of said pattern of said second mask; and a fourth step for using one of said first and second alignment sensor systems to measure the position of a given shot area on a second substrate so as to provide measurement results, and using these measurement results, the difference between said relative positions measured in said first step, and the distance measured in said third step so as to establish alignment between said given shot area on said second substrate and said pattern of said second mask.

2. An alignment method according to claim 1, wherein:
the alignment sensor system used in said third step and the alignment sensor system used in said fourth step are not the same.

3. An alignment method for use with an exposure apparatus including first and second alignment sensor systems using different types of sensing techniques for detecting the position of each of shot areas on a substrate, said first and second alignment sensor systems each having a detection center, wherein detection results from at least one of said first and second sensor systems are used to establish alignment between one of said shot areas on said substrate which is to be exposed and an exposure location for a pattern of a mask so as to transfer said pattern onto said shot areas; said method comprising the steps of:

measuring, for an exposure procedure for a pattern of a given mask, a relative position of said detection center of one of said first and second alignment sensor systems with respect to an exposure center of said pattern of said given mask; and using the other of said first and second alignment sensor systems to measure the position of one of shot areas on a substrate which is to be exposed so as to provide measurement results, and using these measurement results and said relative position measured for said one of said first and second alignment sensor systems so as to establish alignment between said shot area and said pattern of said given mask.

* * * * *